(12) United States Patent
Ito et al.

(10) Patent No.: US 12,446,263 B2
(45) Date of Patent: Oct. 14, 2025

(54) NITRIDE SEMICONDUCTOR DEVICE

(71) Applicant: ROHM CO., LTD., Kyoto (JP)

(72) Inventors: Norikazu Ito, Kyoto (JP); Taketoshi Tanaka, Kyoto (JP); Ken Nakahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 496 days.

(21) Appl. No.: 17/906,808

(22) PCT Filed: Apr. 14, 2021

(86) PCT No.: PCT/JP2021/015487
§ 371 (c)(1),
(2) Date: Sep. 20, 2022

(87) PCT Pub. No.: WO2021/215336
PCT Pub. Date: Oct. 28, 2021

(65) Prior Publication Data
US 2023/0114315 A1    Apr. 13, 2023

(30) Foreign Application Priority Data

Apr. 23, 2020 (JP) ................................ 2020-076664

(51) Int. Cl.
*H10D 30/47* (2025.01)
*H10D 30/67* (2025.01)
(Continued)

(52) U.S. Cl.
CPC ......... *H10D 30/675* (2025.01); *H10D 30/475* (2025.01); *H10D 30/4755* (2025.01);
(Continued)

(58) Field of Classification Search
None
See application file for complete search history.

(56) References Cited

U.S. PATENT DOCUMENTS

| | | | |
|---|---|---|---|
| 2010/0330754 A1* | 12/2010 | Hebert | H10D 30/015 257/E21.403 |
| 2016/0049347 A1* | 2/2016 | Negoro | H10D 30/475 257/472 |

FOREIGN PATENT DOCUMENTS

| | | |
|---|---|---|
| JP | 2005086171 A | 3/2005 |
| JP | 2008227501 A | 9/2008 |

(Continued)

OTHER PUBLICATIONS

International Search Report issued for International Patent Application No. PCT/JP2021/015487, Date of mailing: Jul. 20, 2021, 5 pages including English translation.
(Continued)

*Primary Examiner* — Grant S Withers
(74) *Attorney, Agent, or Firm* — XSENSUS LLP

(57) ABSTRACT

A nitride semiconductor device includes an electron transit layer, an electron supply layer that is formed on the electron transit layer, a gate layer that is formed on the electron supply layer and contains an $Al_{1-X}Ga_XN$ (0<X<1) based material containing a first impurity, a gate electrode that is formed on the gate layer and is in Schottky junction with the gate layer, and a source electrode and a drain electrode that are electrically connected to the electron supply layer. By this arrangement, a gate withstand voltage can be improved and therefore, a nitride semiconductor device of high reliability can be provided.

11 Claims, 7 Drawing Sheets

(51) Int. Cl.
*H10D 62/824* (2025.01)
*H10D 62/85* (2025.01)
*H10D 64/64* (2025.01)

(52) U.S. Cl.
CPC ....... *H10D 30/6738* (2025.01); *H10D 62/824* (2025.01); *H10D 62/85* (2025.01); *H10D 62/8503* (2025.01); *H10D 64/64* (2025.01)

(56) References Cited

FOREIGN PATENT DOCUMENTS

| | | | |
|---|---|---|---|
| JP | 2010533987 | A | 10/2010 |
| JP | 2014072425 | A | 4/2014 |
| JP | 2014207287 | A | 10/2014 |
| JP | 2017017071 | A | 1/2017 |
| JP | 2017521869 | A | 8/2017 |
| JP | 2018196026 | A | 12/2018 |
| JP | 2019134041 | A | 8/2019 |

OTHER PUBLICATIONS

Written Opinion issued for International Patent Application No. PCT/JP2021/015487, Date of mailing: Jul. 20, 2021, 7 pages including English machine translation.

Office Action dated Feb. 20, 2025 in corresponding Japanese patent application No. 2022-517003 (10 pages; with English machine translation).

Office Action dated Apr. 19, 2025 in corresponding Chinese patent application No. 202180029895.X (12 pages; with English machine translation).

* cited by examiner

NITRIDE SEMICONDUCTOR DEVICE

TECHNICAL FIELD

The present disclosure relates to a nitride semiconductor device.

BACKGROUND ART

For example, Patent Literature 1 discloses an HEMT including a supporting substrate, a buffer layer on the supporting substrate, an electron transit layer on the buffer layer, an electron supply layer on the electron transit layer, a gate recess that is formed in the electron supply layer and reaches the electron transit layer, an insulating film that is formed on a wall surface of the gate recess and on the electron supply layer, a gate electrode that is embedded on the insulating film, and a source electrode and a drain electrode that are formed such as to be in ohmic contact with the electron supply layer and are electrically connected to a two-dimensional electron gas layer via the electron supply layer.

CITATION LIST

Patent Literature

Patent Literature 1: Japanese Patent Application Publication No. 2014-207287

SUMMARY OF INVENTION

Technical Problem

A nitride semiconductor device according to a preferred embodiment of the present disclosure includes an electron transit layer, an electron supply layer that is formed on the electron transit layer, a gate layer that is formed on the electron supply layer and contains an $Al_{1-X}Ga_XN$ (0<X<1) based material containing a first impurity, a gate electrode that is formed on the gate layer and is in Schottky junction with the gate layer, and a source electrode and a drain electrode that are electrically connected to the electron supply layer.

DESCRIPTION OF EMBODIMENTS

<Preferred Embodiments of the Present Disclosure>

Figure 1:
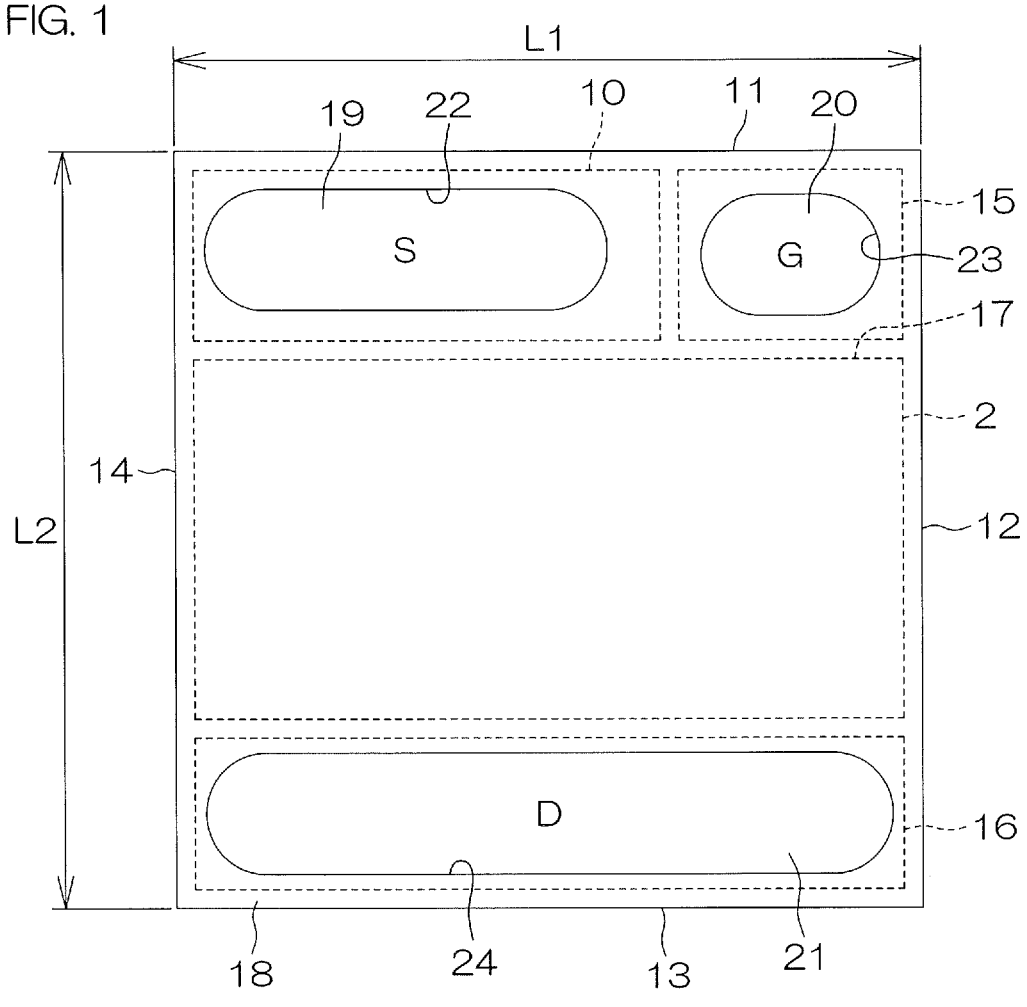
FIG. 1 is a schematic plan view of a nitride semiconductor device according to a preferred embodiment of the present disclosure.

First, preferred embodiments of the present disclosure shall be listed and described.

A nitride semiconductor device according to a preferred embodiment of the present disclosure includes an electron transit layer, an electron supply layer that is formed on the electron transit layer, a gate layer that is formed on the electron supply layer and contains an $Al_{1-X}Ga_XN$ (0<X<1) based material containing a first impurity, a gate electrode that is formed on the gate layer and is in Schottky junction with the gate layer, and a source electrode and a drain electrode that are electrically connected to the electron supply layer.

A nitride semiconductor device according to a preferred embodiment of the present disclosure may include an electron transit layer, an electron supply layer that is formed on the electron transit layer, a gate layer that is formed on the electron supply layer and contains an $Al_{1-X}Ga_XN$ (0<X<1) based semi-insulating material containing a first impurity, a gate electrode that is formed on the gate layer and is in Schottky junction with the gate layer, and a source electrode and a drain electrode that are electrically connected to the electron supply layer.

By the nitride semiconductor device according to the preferred embodiment of the present disclosure, a gate withstand voltage can be improved and therefore, a nitride semiconductor device of high reliability can be provided. Further, the gate electrode is in Schottky junction with the gate layer and therefore, a gate leak current can also be reduced.

With the nitride semiconductor device according to the preferred embodiment of the present disclosure, the gate electrode may contain at least one type of substance among TiN, Ti, Al, W, Mo, and TaN.

With the nitride semiconductor device according to the preferred embodiment of the present disclosure, the first impurity may include at least one type of element among Mg and Zn.

With the nitride semiconductor device according to the preferred embodiment of the present disclosure, the gate layer may have a thickness of not less than 60 nm and a concentration of the first impurity of not less than $3\times10^{18}$ $cm^{-3}$.

With the nitride semiconductor device according to the preferred embodiment of the present disclosure, the gate layer may have a thickness of not less than 100 nm.

With the nitride semiconductor device according to the preferred embodiment of the present disclosure, the electron transit layer may contain a GaN based material, the electron supply layer may contain an $Al_{1-X}Ga_XN$ (0<X<1) based material, and the gate layer may have an Al composition ratio that is less than an Al composition ratio of the electron supply layer.

With the nitride semiconductor device according to the preferred embodiment of the present disclosure, the gate layer may include a first portion that is relatively low in Al composition ratio and a second portion that is formed at an opposite side of the electron supply layer with respect to the first portion and has an Al composition ratio relatively higher than that of the first portion and an average Al composition ratio of the first portion and the second portion may be less than the Al composition ratio of the electron supply layer.

With the nitride semiconductor device according to the preferred embodiment of the present disclosure, an Al composition ratio of the gate layer may increase linearly or stepwise from the electron supply layer toward the gate electrode.

With the nitride semiconductor device according to the preferred embodiment of the present disclosure, a mesa structure portion having a wall surface that extends continuously across the gate layer and the gate electrode and is inclined with respect to a front surface of the electron supply layer may be included.

With the nitride semiconductor device according to the preferred embodiment of the present disclosure, the gate electrode may have a smaller thickness than the gate layer.

With the nitride semiconductor device according to the preferred embodiment of the present disclosure, the gate electrode may be formed in an inner region of the gate layer such that a step is formed between a side surface of the gate layer and a side surface of the gate electrode.

With the nitride semiconductor device according to the preferred embodiment of the present disclosure, the gate electrode may have a greater thickness than the gate layer.

<Detailed Description of a Preferred Embodiment of the Present Disclosure>

Next, a preferred embodiment of the present disclosure shall be described in detail with reference to the attached drawings.

<<Planar Structure of Nitride Semiconductor Device 1>>

Figure 2:
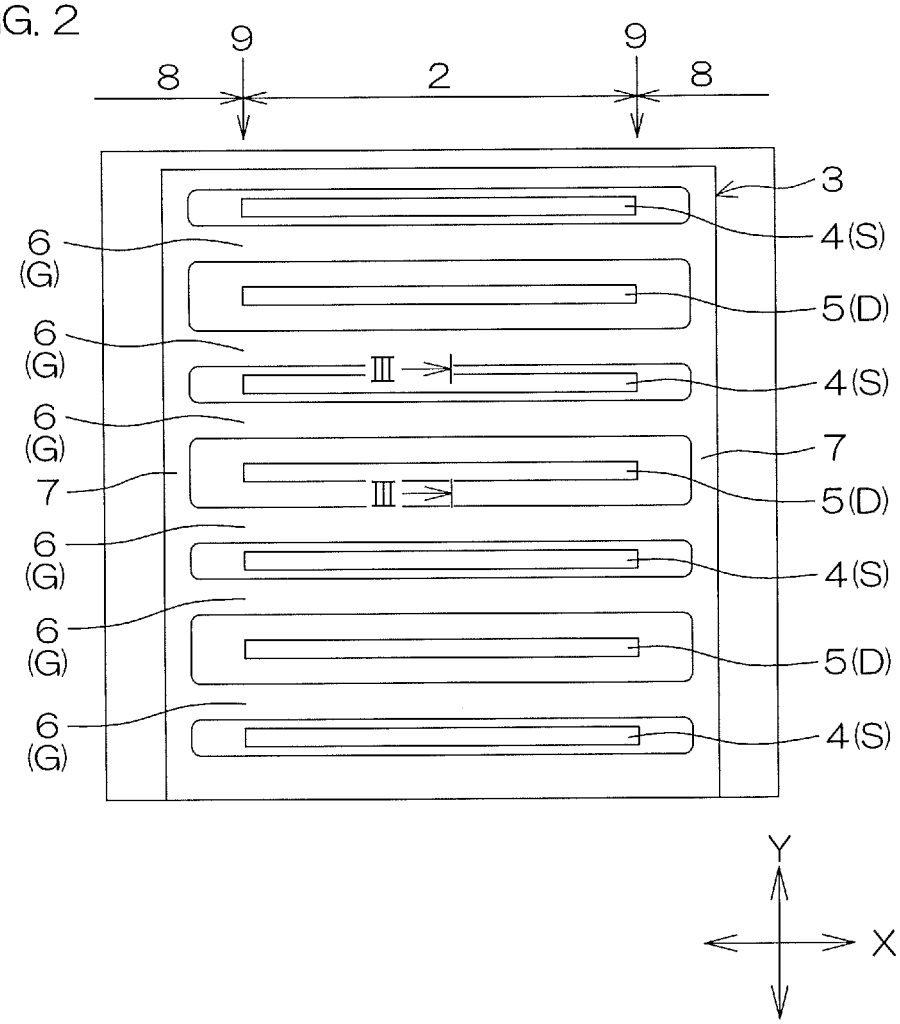
FIG. 2 is a schematic plan view of the internal structure of the nitride semiconductor device of FIG. 1.

FIG. 1 is a schematic plan view of a nitride semiconductor device 1 according to the preferred embodiment of the present disclosure. FIG. 2 is a schematic plan view of the internal structure of the nitride semiconductor device 1 of FIG. 1.

The nitride semiconductor device 1 may be a chip that is formed to a quadrilateral shape in plan view as shown in FIG. 1. In this preferred embodiment, the nitride semiconductor device 1 is formed to a square shape in plan view and, for example, has a first side 11, a second side 12, a third side 13, and a fourth side 14 successively in a clockwise direction.

A length L1 of the first side 11 and the third side 13 of the nitride semiconductor device 1 may, for example, be 0.5 mm to 10 mm and a length L2 of the second side 12 and the fourth side 14 may, for example, be 0.5 mm to 10 mm.

An active region 2 is formed in a substantially central portion on the nitride semiconductor device 1. As shown in FIG. 2, with a set of a gate electrode 3 and a source electrode 4 and drain electrode 5 that are disposed such as to sandwich the gate electrode 3 from both sides being one unit, the active region 2 has a structure in which the units are aligned in parallel to each other.

More specifically, the source electrodes 4 and the drain electrodes 5 extend in an X direction. The gate electrode 3 includes a plurality of electrode portions 6 that extend in parallel to each other in the X direction and two base portions 7 that respectively couple corresponding end portions of the plurality of electrode portions 6 to each other.

In the example of FIG. 2, the source electrodes 4 (S), the electrode portions 6 (G) of the gate electrode 3, and the drain electrodes 5 (D) are disposed periodically in the order of DGSGDGS in a Y direction. An element structure is thereby arranged by each electrode portion 6 (G) of the gate electrode 3 being sandwiched by a source electrode 4 (S) and a drain electrode 5 (D). A region of a front surface on a semiconductor laminated structure 28 (to be described below) is constituted of the active region 2 that includes the element structure and a nonactive region 8 other than the active region 2. In FIG. 2, the reference sign 9 indicates isolation lines that are boundary lines between the active region 2 and the nonactive region 8. The base portions 7 of the gate electrode 3 respectively couple the corresponding end portions of the plurality of electrode portions 6 to each other in the nonactive region 8.

In this preferred embodiment, the active region 2 is of a rectangular shape in plan view that is long in a direction along the first side 11 and the third side 13 and has a length of substantially the same magnitude as the length L1 of the first side 11.

A source electrode film 10, a gate electrode film 15, and a drain electrode film 16 are disposed as electrodes led out from the source electrodes 4, the gate electrode 3, and the drain electrodes 5 of the respective units of the active region 2. As the source electrode film 10, the gate electrode film 15, and the drain electrode film 16, for example, Al films or other metal films can be applied. Also, the source electrode film 10, the gate electrode film 15, and the drain electrode film 16 may respectively be referred to as a source metal, a gate metal, and a drain metal based on the constituent material or may simply be referred to as a source electrode, a gate electrode, and a drain electrode based on the functional aspect.

The source electrode film 10 is formed at the first side 11 side with respect to the active region 2. In this preferred embodiment, the source electrode film 10 is formed to a rectangular shape in plan view that has a narrower width than the active region 2.

A region 17 that is constituted of a step formed by a difference in width of the active region 2 and the source electrode film 10 is formed in a region on the nitride semiconductor device 1. The region 17 may be formed by an intersection portion of the first side 11 and the second side 12 of the nitride semiconductor device 1 as shown in FIG. 1.

The gate electrode film 15 is disposed in the region 17 formed by the step between the active region 2 and the source electrode film 10 (the intersection portion of the first side 11 and the second side 12 of the nitride semiconductor device 1 in this preferred embodiment) and is formed to a quadrilateral shape in plan view.

The drain electrode film 16 is disposed between the active region 2 and the third side 13 of the nitride semiconductor device 1 and is formed to a rectangular shape in plan view that has a width of substantially the same magnitude as the length L1 of the first side 11. That is, the drain electrode film 16 may be formed to a rectangular shape that is long in the direction along the first side 11 and the third side 13.

The source electrode film 10, the gate electrode film 15, and the drain electrode film 16 are covered by a front surface insulating film 18. As the front surface insulating film 18, for example, SiN, etc., can be applied. Openings 22, 23, and 24 that expose portions of the source electrode film 10, the gate electrode film 15, and the drain electrode film 16 as a source pad 19, a gate pad 20, and a drain pad 21, respectively, are formed in the front surface insulating film 18.

The source pad 19 is formed, for example, to a substantially elliptical shape oriented along the first side 11 of the nitride semiconductor device 1 in a vicinity of the first side 11. The source pad 19 of substantially elliptical shape may be of a shape that includes a pair of straight lines extending along the first side 11 and opposing each other in a direction intersecting the first side 11 and semicircles joining respective end portions of the pair of sides to each other as shown in FIG. 1.

The gate pad 20 is disposed along the first side 11 of the nitride semiconductor device 1 at an interval from the source pad 19. That is, the source pad 19 and the gate pad 20 may be juxtaposed along the first side 11 of the nitride semiconductor device 1. Also, as with the source pad 19, the shape of the gate pad 20 may be a substantially elliptical shape oriented along the first side 11.

The drain pad 21 is formed, for example, to a substantially elliptical shape oriented along the third side 13 of the nitride semiconductor device 1 in a vicinity of the first side 13. The drain pad 21 of substantially elliptical shape may be of a shape that includes a pair of straight lines extending along the third side 13 and opposing each other in a direction intersecting the third side 13 and semicircles joining respective end portions of the pair of sides to each other as shown in FIG. 1. In this preferred embodiment, a length of the pair of straight lines may be of substantially the same magnitude as the length L1 of the first side 11 of the nitride semiconductor device 1. In this case, the drain pad 21 may oppose both the source pad 19 and the gate pad 20 in the direction intersecting the first side 11.

In regard to the shapes, configurations, numbers, etc., of the source pad 19, the gate pad 20, and the drain pad 21, the above-described example is merely one example and these may be changed as appropriate according to design.

<<Cross-Sectional Structure of the Nitride Semiconductor Device 1>>

Figure 3:
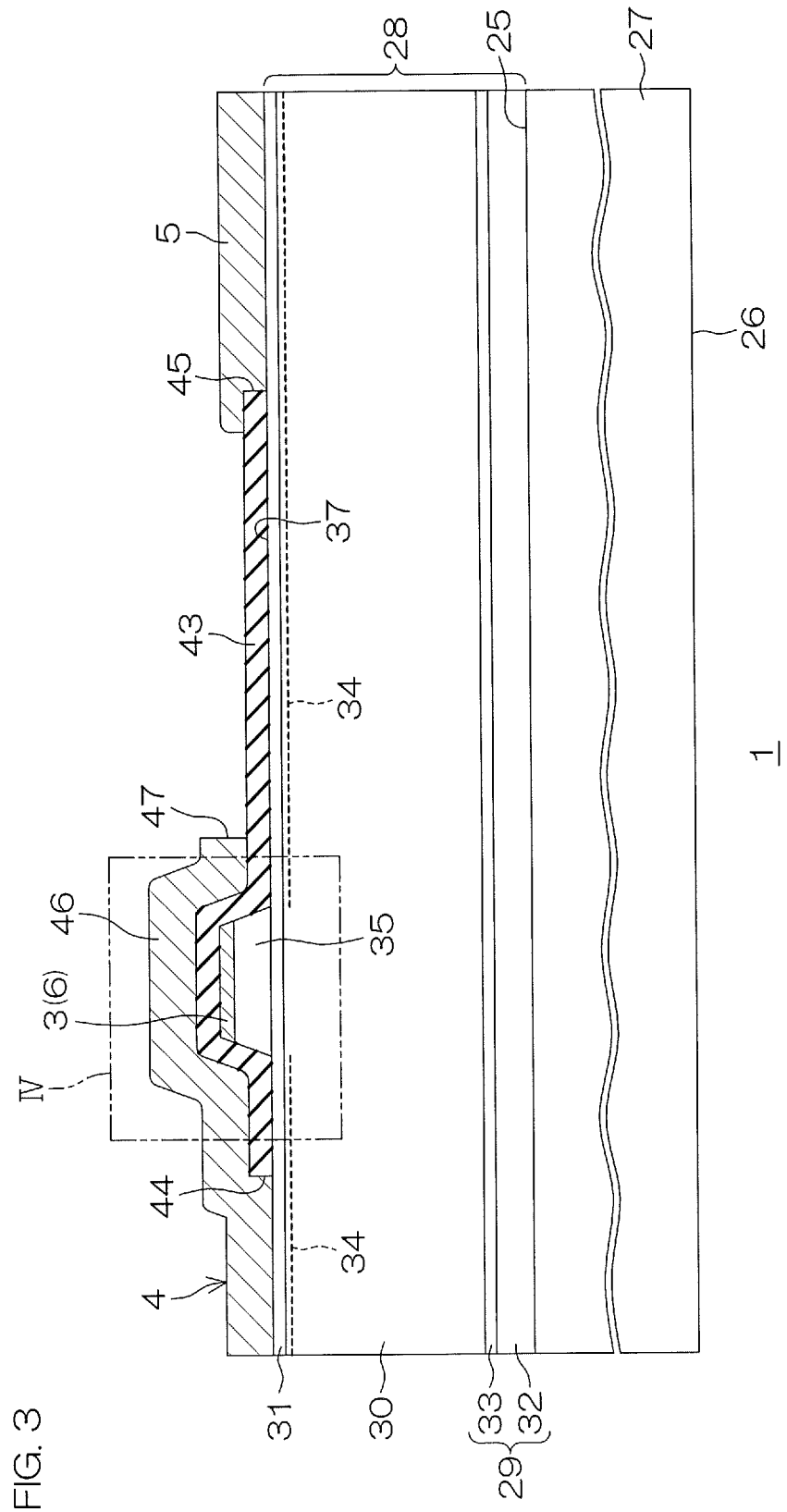
FIG. 3 is a diagram of a section taken along III-III of FIG. 2.
Figure 4:
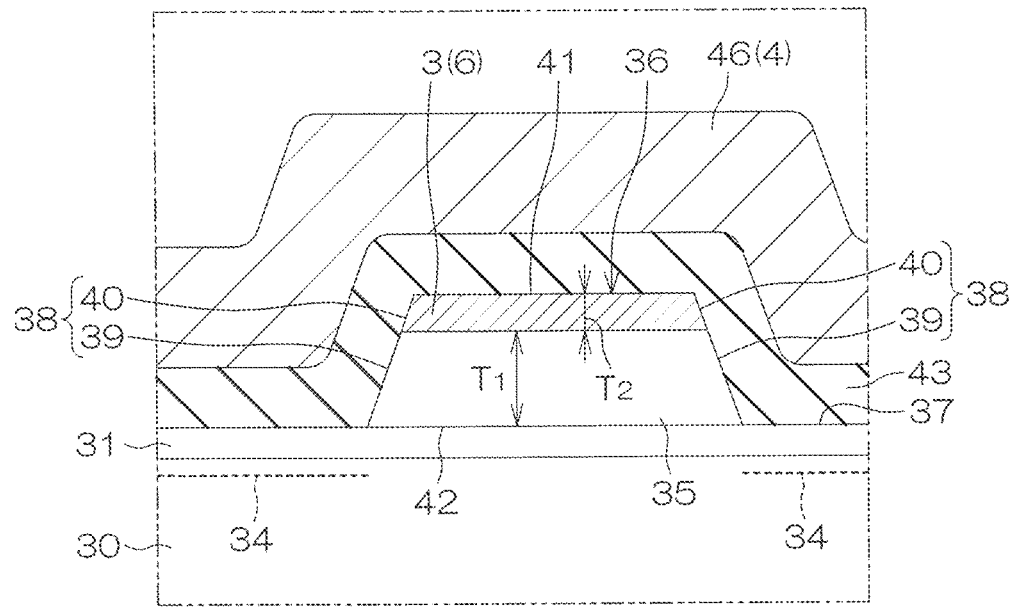
FIG. 4 is a principal portion enlarged view of a portion surrounded by alternate long and two short dashed lines IV of FIG. 3.
Figure 5:
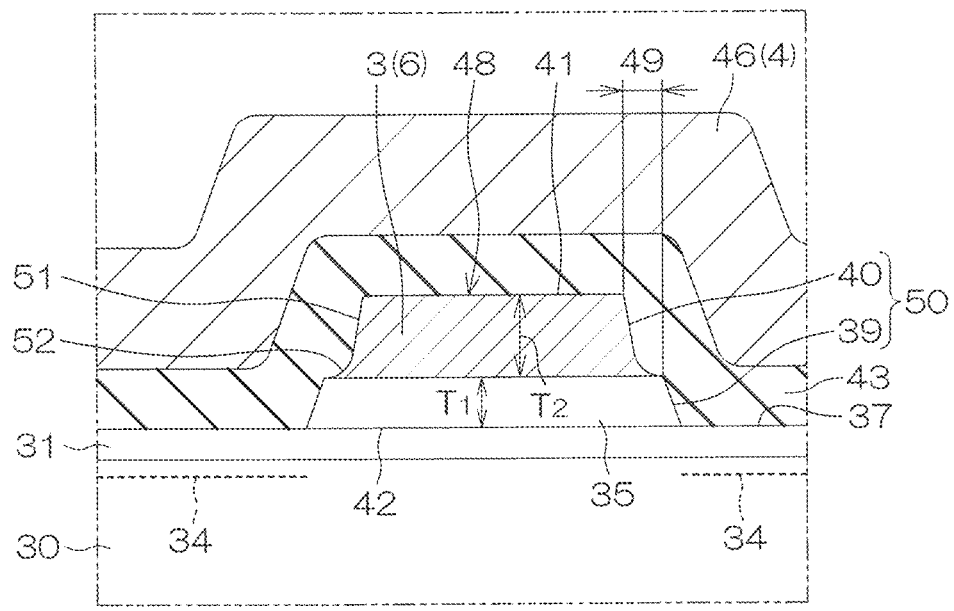
FIG. 5 is a diagram for describing a variation of a gate structure of FIG. 4.

FIG. 3 is a diagram of a section taken along III-III of FIG. 2. FIG. 4 is a principal portion enlarged view of a portion surrounded by alternate long and two short dashed lines IV of FIG. 3. FIG. 5 is a diagram for describing a variation of a gate structure of FIG. 4.

The nitride semiconductor device 1 includes a substrate 27 that has a first surface 25 and a second surface 26 at an opposite side of the first surface 25 and the semiconductor laminated structure 28 that is formed on the first surface 25 of the substrate 27.

As the substrate 27, for example, an insulating substrate such as a sapphire substrate, etc., or a semiconductor substrate such as an Si substrate, SiC substrate, GaN substrate, etc., can be applied. In this preferred embodiment, the substrate 27 is an Si substrate. Also, a thickness of the substrate 27 may, for example, be 400 µm to 1000 µm. Also, the first surface 25 and the second surface 26 of the substrate 27 may respectively be referred to as a front surface and a rear surface of the substrate 27. Also, the second surface 26 of the substrate 27 may be an exposed surface on which a structure such as an electrode, a semiconductor laminated structure, etc., is not formed.

The semiconductor laminated structure 28 is a laminated structure arranged from a plurality of semiconductor layers that are constituted of mutually different compositions. In this preferred embodiment, the semiconductor laminated structure 28 includes a buffer layer 29, an electron transit layer 30, and an electron supply layer 31 in that order from the side close to the first surface 25 of the substrate 27. These layers 29 to 31 may be formed by epitaxially growing a raw material on the first surface 25 of the substrate 27.

As the buffer layer 29, there is no restriction in particular as long as it is, for example, that which can relax lattice mismatch of the electron transit layer 30 with respect to the substrate 27. The buffer layer 29 may, for example, be a multilayer buffer layer in which a plurality of nitride semiconductor layers are laminated. In this preferred embodiment, the buffer layer 29 includes a first buffer layer 32 that is constituted of an AlN layer in contact with the first surface 25 of the substrate 27 and a second buffer layer 33 that is constituted of an AlGaN layer laminated on the first buffer layer 32. A thickness of the first buffer layer 32 may, for example, be approximately 50 nm to 500 nm. A thickness of the second buffer layer 33 is, for example, greater than that of the first buffer layer 32 and may be approximately 50 nm to 2000 nm. The buffer layer 29 may instead be a single layer of AlN or a single layer of AlGaN.

As the electron transit layer 30, for example, an undoped nitride semiconductor can be adopted and it may specifically be a layer constituted of an undoped $Al_{1-X}Ga_XN$ ($0<X \leq 1$) based material. An undoped nitride semiconductor layer means, for example, a semiconductor layer that is formed without intentionally doping with an impurity in a crystal growth process of the electron transit layer 30 and besides Al, Ga, and N that constitute the electron transit layer 30, other elements of several types may be mixed in unintentionally.

Also, a thickness of the electron transit layer 30 is, for example, not more than 0.3 µm and may be not less than 0.01 µm. Here, the electron transit layer 30 is a layer in which a channel of the nitride semiconductor device 1 is formed by forming of a two-dimensional electron gas 34 to be described below and may thus be referred to as a channel layer.

As the electron supply layer 31, for example, a layer constituted of an $Al_{1-X}Ga_XN$ ($0 \leq X < 1$) based material that differs in Al composition ratio from the electron transit layer 30 can be applied. For example, the electron transit layer 30 may be a GaN layer and the electron supply layer 31 may be an AlGaN layer. Also, a thickness of the electron supply layer 31 may, for example, be 5 nm to 100 nm if the electron supply layer 31 is AlGaN and may be 1 nm to 5 nm if the electron supply layer 31 is AlN. Also, the electron supply layer 31 may be referred to as a barrier layer.

The electron transit layer 30 and the electron supply layer 31 are thus constituted of nitride semiconductors differing in Al composition ratio and a lattice mismatch occurs between the two. And due to polarization caused by the lattice mismatch, the two-dimensional electron gas 34 that is formed by the polarization spreads at a position close to an interface between the electron transit layer 30 and the electron supply layer 31 (for example, at a position of approximately several Å from the interface).

A gate layer 35 is formed on the semiconductor laminated structure 28 and the gate electrode 3 is formed on the gate layer 35.

The gate layer 35 is formed selectively on a portion of a front surface 37 of the electron supply layer 31. The gate layer 35 is constituted of an $Al_{1-X}Ga_XN$ ($0<X<1$) based material. In this preferred embodiment, the gate layer 35 contains, as an impurity, at least one type of element among Mg and Zn as an example of a first impurity of the present disclosure. The $Al_{1-X}Ga_XN$ ($0<X<1$) based material of the gate layer 35 may be a semi-insulating material. The semi-insulating material may be defined as an $Al_{1-X}Ga_XN$ ($0<X<1$) based material with which after the $Al_{1-X}Ga_XN$ ($0<X<1$) based material is epitaxially grown while doping with the abovementioned impurity in the process of forming the gate layer 35, the impurity is in an inactive state due to an annealing treatment for activating the impurity not being performed.

Also, as shown in FIG. 4, a thickness $T_1$ of the gate layer 35 may, for example, be not less than 60 nm, preferably be 60 nm to 165 nm, and more preferably be 100 nm to 165 nm.

Also, an impurity concentration of the gate layer 35 (a total concentration of both Mg and Zn if both are contained) may, for example, be not less than $3\times10^{18}$ cm$^{-3}$ and preferably be $3\times10^{18}$ cm$^{-3}$ to $5\times10^{20}$ cm$^{-3}$.

With the nitride semiconductor device 1, positive polarization charges that are generated in a vicinity of the heterointerface of the electron supply layer 31 with the electron transit layer 30 is canceled out by spontaneous polarization occurring inside the gate layer 35 and consequently, the two-dimensional electron gas 34 is eliminated selectively in a region directly below the gate electrode 3. A distribution region of the two-dimensional electron gas 34 is thereby divided with the region directly below the gate electrode 3 as a boundary and normally-off operation of the nitride semiconductor device 1 is achieved.

The gate electrode 3 is in Schottky junction with the gate layer 35. As a material of the gate electrode 3, there is no restriction in particular as long as it can be in Schottky junction with the gate layer 35. For example, with respect to the gate layer 35 that is constituted of an AlGaN based material, the gate electrode 3 may be of at least one type of substance among TiN, Ti, Al, W, Mo, and TaN.

Also, as shown in FIG. 4, a thickness $T_2$ of the gate electrode 3 may be less than the thickness $T_1$ of the gate layer 35 and may, for example, be not less than 100 nm, preferably be 50 nm to 150 nm.

Also, in this preferred embodiment, laminated structures of the gate layer 35 and the gate electrode 3 forms mesa structure portions 36 as shown in FIG. 4. The mesa structure portions 36 extend as stripes at intervals from each other as indicated by the gate electrode 3 (electrode portions 6) in FIG. 2 and may be referred to as ridge structures.

Each mesa structure portion 36 has wall surfaces 38 that are inclined with respect to the front surface 37 of the electron supply layer 31. Each wall surface 38 extends continuously across the gate layer 35 and the gate electrode 3. In other words, each wall surface 38 is formed by a side surface 39 of the gate layer 35 and a side surface 40 of the gate electrode 3 being continuous without a step such as to form a single flat surface. The mesa structure portion 36 may thereby be of a substantially isosceles trapezoidal shape having an upper surface 41 of the gate electrode 3 as an upper base and having a lower surface 42 of the gate layer 35 as a lower base in sectional view as shown in FIG. 4.

An insulating layer 43 is formed on the semiconductor laminated structure 28 such as to cover the gate electrode 3. As the insulating layer 43, for example, SiO$_2$, etc., can be applied. Also, a thickness of the insulating layer 43 may, for example, be 50 nm to 300 nm.

Source contact holes 44 and drain contact holes 45 that expose the electron supply layer 31 are formed in the insulating layer 43. The source electrodes 4 and the drain electrodes 5 are respectively formed in the source contact holes 44 and the drain contact holes 45.

Each source electrode 4 is in ohmic contact with the electron supply layer 31. The source electrode 4 may have a lower layer (for example, a Ti layer) that is in ohmic contact with the electron supply layer 31 and an upper layer (for example, an Al layer) that is laminated on the lower layer. Also, the source electrode 4 has an extension portion 46 that extends from the contact hole 44 toward the drain electrode 5. The extension portion 46 is formed such as to cover the gate electrode 3 and, in a direction along the front surface 37 of the electron supply layer 31, has an end portion 47 between the gate electrode 3 and the drain electrode 5.

Each drain electrode 5 is in ohmic contact with the electron supply layer 31. The drain electrode 5 may have a lower layer (for example, a Ti layer) that is in ohmic contact with the electron supply layer 31 and an upper layer (for example, an Al layer) that is laminated on the lower layer.

<<Variation of the Gate Structure

Next, a variation of the gate structures formed by the gate layer 35 and the gate electrode 3 shall be described with reference to FIG. 5.

In FIG. 4, each gate structure forms the mesa structure portion 36 having the wall surfaces 38 extending continuously across the gate layer 35 and the gate electrode 3. On the other hand, each mesa structure portion 48 of FIG. 5 that is formed by the gate layer 35 and the gate electrode 3 has wall surfaces 50 each having a step 49 at a boundary portion between the gate layer 35 and the gate electrode 3. More specifically, the side surface 40 of the gate electrode 3 is formed at a position separated toward an inner side of the gate layer 35 from the side surface 39 of the gate layer 35. The gate electrode 3 is thereby formed on an inner region of the gate layer 35.

Also, the side surfaces 39 of the gate layer 35 and side surfaces 40 of the gate electrode 3 are respectively inclined with respect to the front surface 37 of the electron supply layer 31. Further, each side surface 40 of the gate electrode 3 may include a flat surface 51 that is inclined with respect to the front surface 37 of the electron supply layer 31 and a curved surface 52 that is continuous to the flat surface 51 and bulges toward the inner region of the gate layer 35. For example, the side surfaces 40 of lower portions of the gate electrode 3 may be curved surfaces 52. The curved surfaces 52 may be continuous to the side surfaces 39 of the gate layer 35.

Also, with the mesa structure portions 48, the thickness $T_2$ of the gate electrode 3 may be greater than the thickness $T_1$ of the gate layer 35. In this case, the thickness $T_1$ of the gate layer 35 may be 50 nm to 150 nm and the thickness $T_2$ of the gate electrode 3 may be 100 nm to 300 nm.

<<Al Composition Ratio of the Gate Layer 35>>

Next, an Al composition ratio of the gate layer 35 shall be described in detail with reference to FIG. 6 to FIG. 8.

Figure 6:
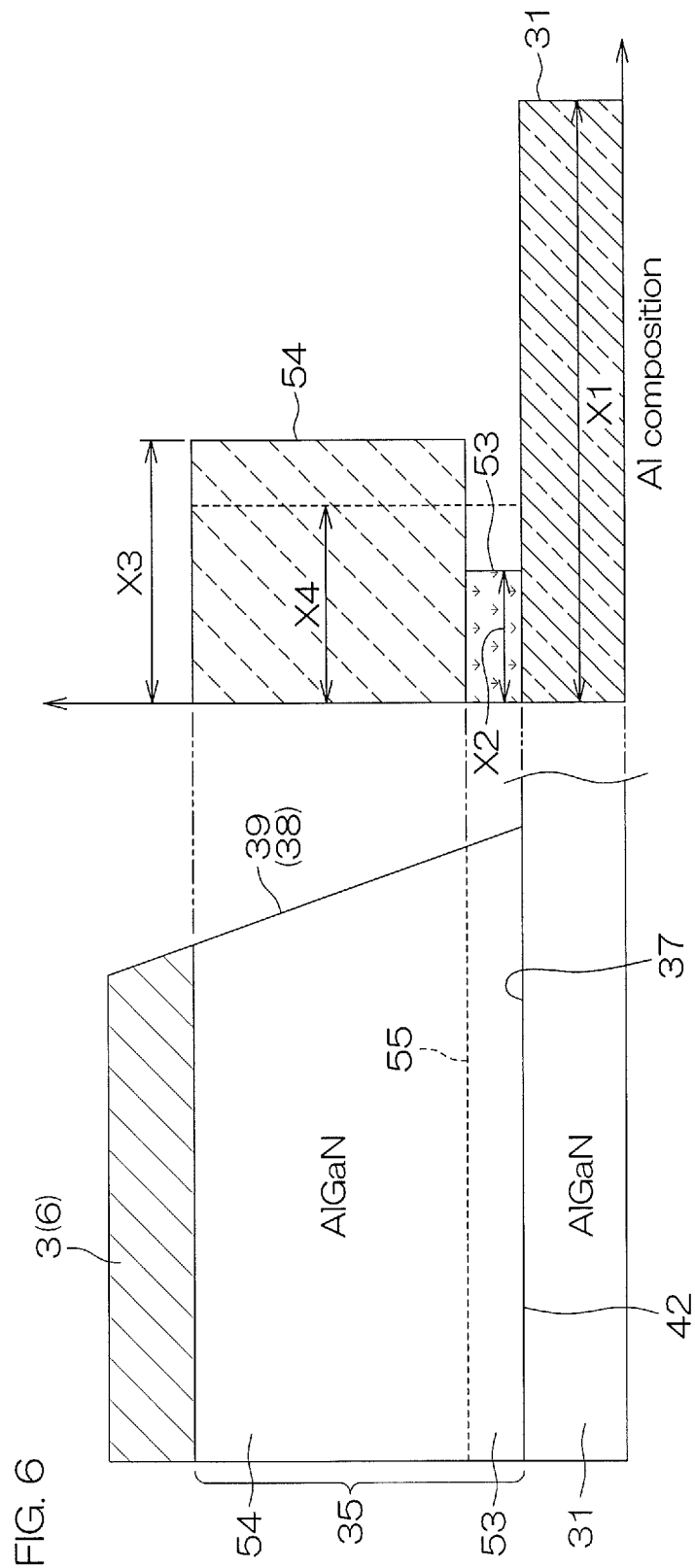
FIG. 6 is a diagram for comparing Al composition ratios of an electron supply layer and a gate layer.

FIG. 6 is a diagram for comparing Al composition ratios of the electron supply layer 31 and the gate layer 35.

As described above, the electron supply layer 31 may be constituted of an Al$_{1-X}$Ga$_X$N (0≤X<1) based material and the gate layer 35 may be constituted of an Al$_{1-X}$Ga$_X$N (0<X<1) based material. Therefore, if the electron supply layer 31 is constituted of an Al$_{1-X}$Ga$_X$N (0<X<1) based material, both the electron supply layer 31 and the gate layer 35 may be AlGaN layers.

In this case, the gate layer 35 preferably has an Al composition ratio (an average Al composition ratio X4 to be described below) that is less than an Al composition ratio X1 of the electron supply layer 31. For example, the Al composition ratio X1 of the AlGaN electron supply layer 31 may be 15% to 30% and the Al composition ratio X4 of the AlGaN gate layer 35 may be 5% to 10%. Thereby, forming of cracks in the gate layer 35 can be suppressed and flowing of a gate leak current can be prevented.

Although the electron supply layer 31 that is grown, with a lattice constant close to a lattice constant of GaN, from a base GaN layer (the electron transit layer 30) is an AlGaN layer, it has a lattice constant close to the lattice constant of GaN at its front surface 37. Therefore, by decreasing the Al composition ratio of the gate layer 35 and making a crystal structure of the gate layer 35 approach a crystal structure of GaN, a lattice constant difference between the gate layer 35 and the electron supply layer 31 can be decreased. Consequently, distortion due to the lattice constant difference can be decreased and a crack formation probability in the gate layer 35 can be reduced.

Also, with this preferred embodiment, the gate layer 35 includes a first portion 53 with which an Al composition ratio X2 is relatively low and a second portion 54 that is formed at an opposite side of the electron supply layer 31 with respect to the first portion 53 and has an Al composition ratio X3 relatively higher than that of the first portion 53 as shown in FIG. 6. In this case, an average Al composition ratio ((X2+X3)/2) of the first portion 53 and the second portion 54 may be less than the Al composition ratio X1 of the electron supply layer 31. Also, a thickness of the first portion 53 may be less than a thickness of the second portion 54. For example, the thickness of the first portion 53 may be 5 nm to 30 nm and the thickness of the second portion 54 may be 50 nm to 120 nm.

By making the Al composition ratio X2 of the first portion 53 that is close to the electron supply layer 31 less than the Al composition ratio X3 of the second portion 54, a Schottky characteristic of the gate electrode 3 with respect to the gate layer 35 can be stabilized. Also, the gate layer 35 can be formed with stability to a ridge structure. For example, when selectively etching the gate layer 35, etching is stopped based on a change in etching rate. By forming the first portion 53, a more accurate etching stop is enabled because etching rates of the first portion 53 and the electron supply layer 31 differ greatly.

The first portion 53 and the second portion 54 of the gate layer 35 can be formed, for example, by changing a supply amount of an aluminum raw material gas (for example, trimethylaluminum (TMA1)) that is supplied to a chamber of an epitaxial growth device during epitaxial growth of the gate layer 35. Therefore, a clear boundary does not have to be formed between the first portion 53 and the second portion 54 of the gate layer 35. For example, although a boundary portion 55 between the first portion 53 and the second portion 54 of the gate layer 35 is indicated by a straight broken line, it actually does not have to be a clear straight line. For example, a portion of certain thickness in which the Al composition ratio is found to increase or decrease when a composition analysis in a thickness direction of the gate layer 35 is performed may be defined as an indistinct boundary portion.

Figure 7:
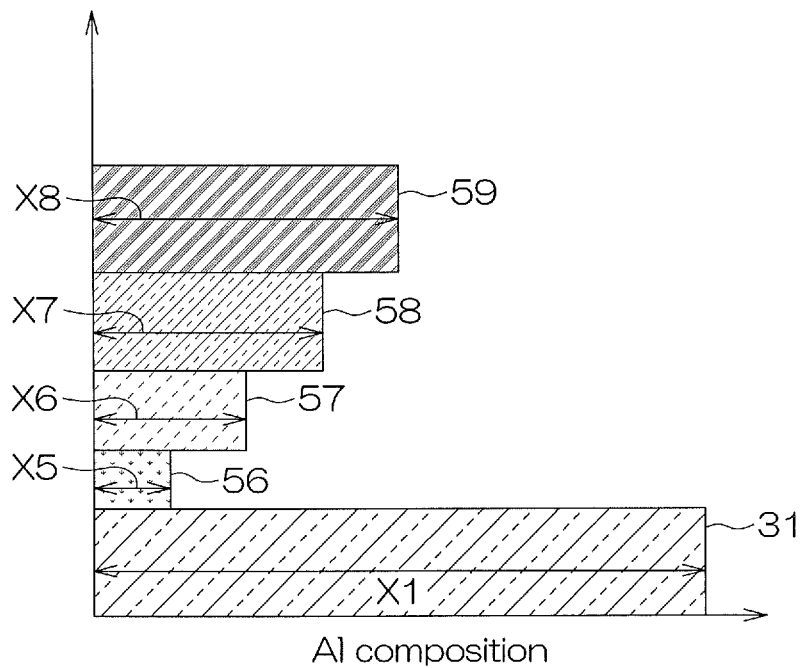
FIG. 7 is a diagram for describing a distribution of the Al composition ratio of the gate layer.
Figure 8:
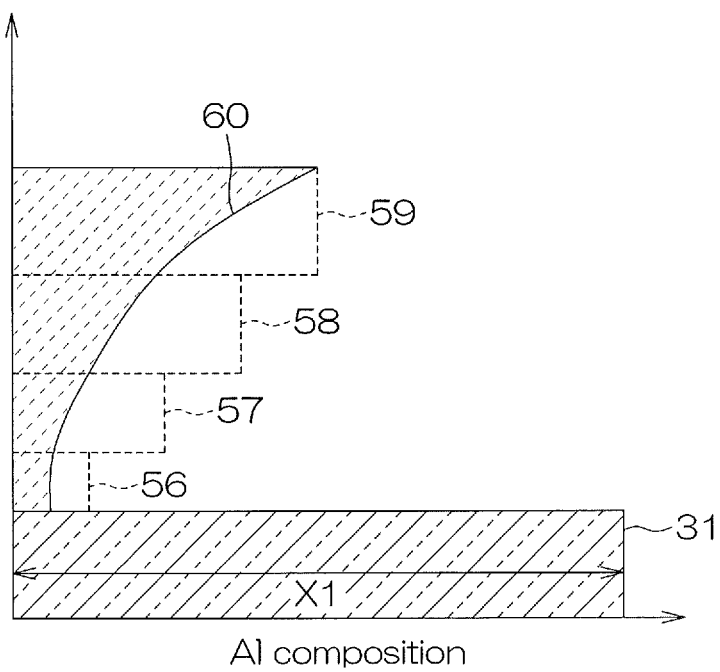
FIG. 8 is a diagram for describing a distribution of the Al composition ratio of the gate layer.

Next, a distribution of the Al composition ratio in the gate layer 35 shall be described in further detail by way of FIG. 7 and FIG. 8 in addition to FIG. 6. FIG. 7 and FIG. 8 are diagrams for describing the distribution of the Al composition ratio of the gate layer 35. Here, in FIG. 7, a case where the gate layer 35 has a first portion 56, a second portion 57, a third portion 58, and a fourth portion 59 in that order from the electron supply layer 31 side as portions differing mutually in Al composition ratio is shown. That is, the gate layer 35 may have, not just two portions as in FIG. 6, but three portions, four portions, or even more portions as portion differing mutually in Al composition ratio.

In FIG. 6 and FIG. 7, the distribution of the Al composition ratio of the gate layer 35 increases stepwise from the electron supply layer 31 toward the gate electrode 3. Stepwise may mean, for example, that when a composition analysis in a thickness direction of the gate layer 35 is performed, it is found that a plurality of portions each having a certain range of Al composition ratio are formed. For example, in FIG. 6, the first portion 53 having an Al composition ratio of 0% to 3% and the second portion 54 having an Al composition ratio of 5% to 15% may be formed and when these Al composition ratios are graphed, steps of certain widths may be formed.

On the other hand, in FIG. 8, the distribution of the Al composition ratio of the gate layer 35 increases linearly from the electron supply layer 31 toward the gate electrode 3 as indicated by a distribution curve 60. Increases linearly may mean, for example, that when a composition analysis in a thickness direction of the gate layer 35 is performed, it is found that the Al composition ratio increases continuously from the electron supply layer 31 toward the gate electrode 3. In FIG. 8, the distribution of the Al composition ratio of FIG. 7 that changes stepwise is indicated by broken lines for comparison.

<<Actions and Effects of the Nitride Semiconductor Device 1>>

Next, actions and effects of the nitride semiconductor device 1 according to this preferred embodiment shall be described.

By the nitride semiconductor device 1 described above, a gate withstand voltage can be improved because the gate layer 35 is constituted of an $Al_{1-X}Ga_XN$ (0<X<1) based material that contains at least one type of element among Mg and Zn. Further, the gate electrode 3 is in Schottky junction with the gate layer 35 and therefore, the gate leak current can also be reduced. Consequently, the nitride semiconductor device 1 of high reliability can be provided.

Figure 9:
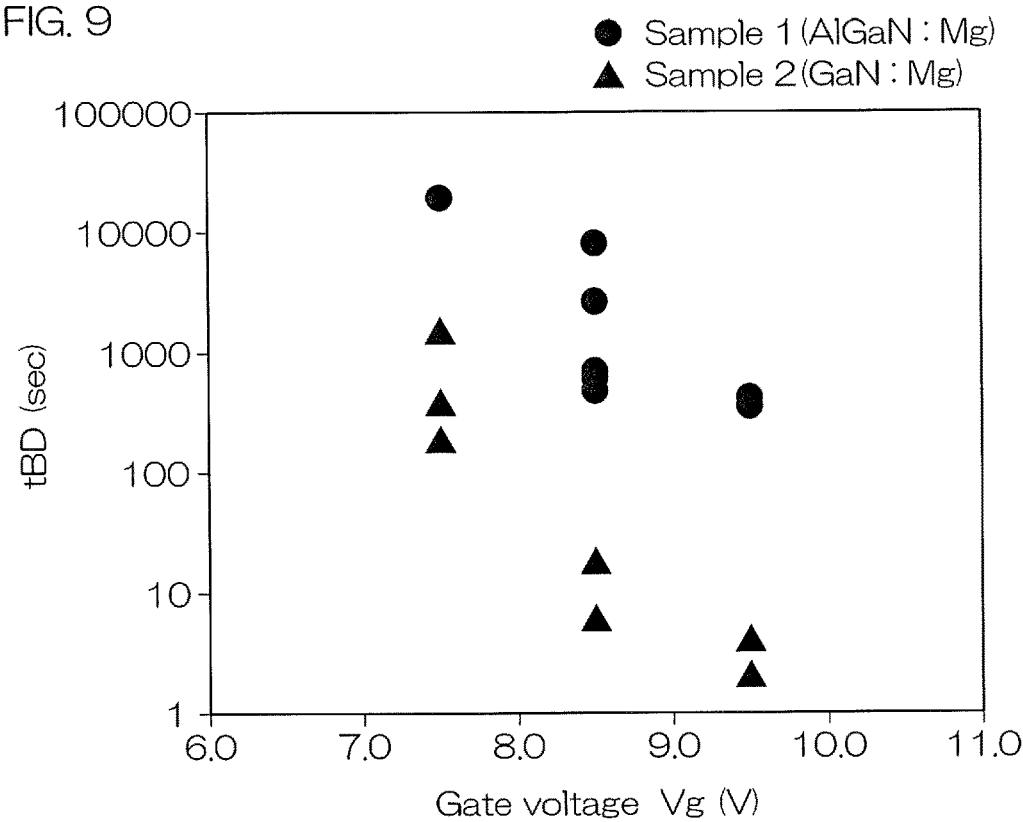
FIG. 9 is a diagram of relationships of gate voltage and dielectric breakdown time (tBD) of Sample 1 and Sample 2.
Figure 10:
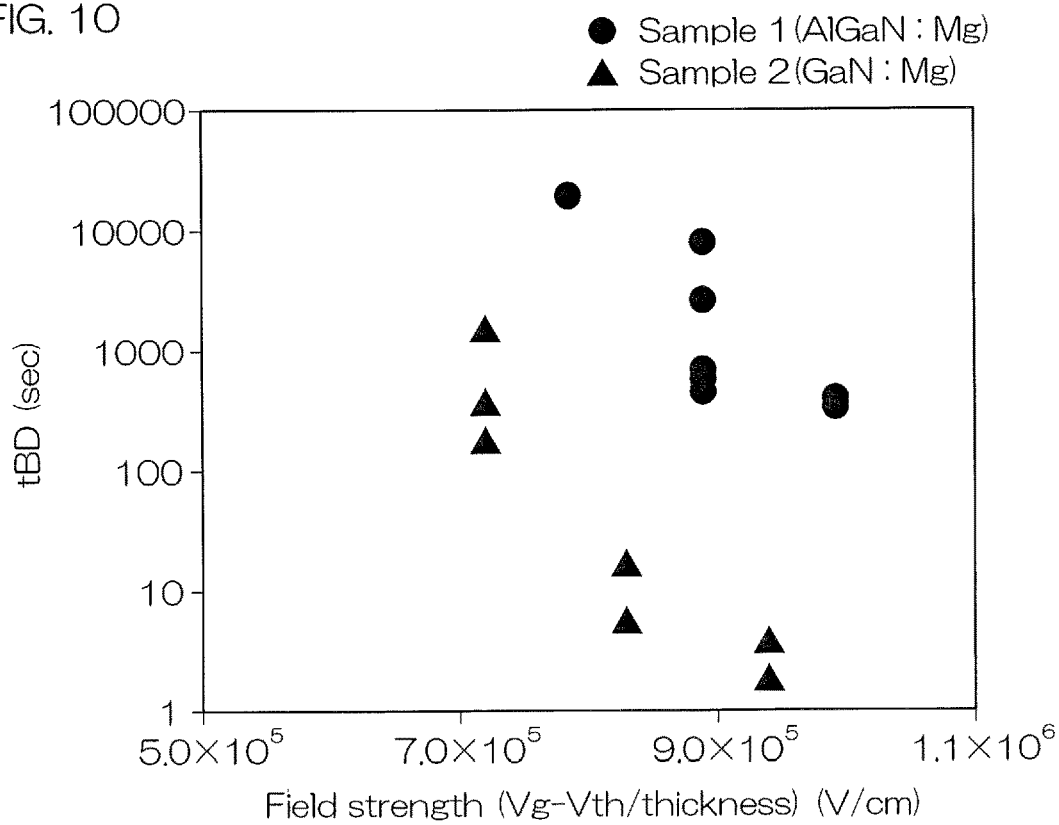
FIG. 10 is a diagram of relationships of field strength and dielectric breakdown time (tBD) of Sample 1 and Sample 2.

That the gate withstand voltage is improved by the AlGaN gate layer 35 is shown in FIG. 9 and FIG. 10. FIG. 9 is a diagram of relationships of gate voltage and dielectric breakdown time (tBD) of Sample 1 and Sample 2. FIG. 10 is a diagram of relationships of field strength and dielectric breakdown time (tBD) of Sample 1 and Sample 2.

More specifically, a TDDB (time dependent dielectric breakdown) test was performed on HEMTs equipped with the gate layers 35 of AlGaN (Mg doped) and GaN (Mg doped) respectively and a comparison was made as to which gate layer among the AlGaN gate layer 35 (Sample 1) and the GaN gate layer 35 (sample 2) breaks down in a short time. Here, the thickness of the gate layer 35 was set to 80 nm, the Al composition ratio was set to 8%, and the concentration Mg was set to $5 \times 10^{19}$ cm$^{-3}$.

As shown in FIG. 9, with Sample 2, as the gate voltage Vg is increased from 7.5 V to 8.5 V and to 9.5 V, the time tBD until breakdown of the gate layer 35 shortens. On the other hand, it can be understood that with Sample 1, although, as in Sample 2, the time tBD shortens as the gate voltage Vg increases, at all gate voltages Vg, the time tBD until breakdown is longer than in Sample 2.

Also, in FIG. 10, the X axis (abscissa) of the graph of FIG. 9 is made to indicate the field strength of the gate layer 35. According to FIG. 10, the field strength of the gate layer 35 of the Sample 1 is shifted to a high field strength side in comparison to the field strength of the gate layer 35 of Sample 2 and it can be understood that the withstand voltage of the gate layer 35 of Sample 1 is superior. For example, when a gate voltage Vg=7.5 V was applied, whereas the field strength of Sample 2 was $7.2 \times 10^5$ V/cm, the field strength of Sample 1 was $7.8 \times 10^5$ V/cm.

While preferred embodiments of the present disclosure were described above, the present disclosure can be implemented in other modes and various design changes can be applied within the scope of matters described in the claims.

The present application corresponds to Japanese Patent Application No. 2020-076664 filed on Apr. 23, 2020 in the Japan Patent Office, and the entire disclosure of this application is incorporated herein by reference.

REFERENCE SIGNS LIST

1: nitride semiconductor device
3: gate electrode
4: source electrode
5: drain electrode
6: electrode portion
7: base portion
10: source electrode film
15: gate electrode film
16: drain electrode film
28: semiconductor laminated structure
30: electron transit layer
31: electron supply layer
35: gate layer
36: mesa structure portion
37: (electron supply layer) front surface
38: (mesa structure portion) wall surface
39: (gate layer) side surface
40: (gate electrode) side surface
48: mesa structure portion
49: step
50: (mesa structure portion) wall surface
51: (gate electrode) flat surface
52: (gate electrode) curved surface
53: (gate layer) first portion
54: (gate layer) second portion
55: boundary portion
56: (gate layer) first portion
57: (gate layer) second portion
58: (gate layer) third portion
59: (gate layer) fourth portion
$T_1$: thickness
$T_2$: thickness
X1: Al composition ratio
X2: Al composition ratio
X3: Al composition ratio
X4: average Al composition ratio

The invention claimed is:

1. A nitride semiconductor device comprising:
an electron transit layer;
an electron supply layer that is formed on the electron transit layer;
a gate layer that is formed on the electron supply layer and includes an $Al_{1-X}Ga_XN$ (0<X<1) based material containing a first impurity;
a gate electrode that is formed on the gate layer and is in Schottky junction with the gate layer; and
a source electrode and a drain electrode that are electrically connected to the electron supply layer, wherein
the electron transit layer includes a GaN based material,
the electron supply layer includes an $Al_{1-X}Ga_XN$ (0<X<1) based material,
the gate layer has an Al composition ratio that is less than an Al composition ratio of the electron supply layer, and
the gate layer includes a first portion that is relatively low in Al composition ratio and a second portion that is formed at an opposite side of the electron supply layer with respect to the first portion and has an Al composition ratio relatively higher than that of the first portion wherein an average Al composition ratio of the first portion and the second portion is less than the Al composition ratio of the electron supply layer.

2. The nitride semiconductor device according to claim 1, wherein the gate electrode contains at least one type of substance among TiN, Ti, Al, W, Mo, and TaN.

3. The nitride semiconductor device according to claim 1, wherein the first impurity includes at least one type of element among Mg and Zn.

4. The nitride semiconductor device according to claim 1, wherein the gate layer has a thickness of not less than 60 nm and a concentration of the first impurity of not less than $3 \times 10^{18}$ cm$^{-3}$.

5. The nitride semiconductor device according to claim 4, wherein the gate layer has a thickness of not less than 100 nm.

6. The nitride semiconductor device according to claim 1, comprising: a mesa structure portion having a wall surface that extends continuously across the gate layer and the gate electrode and is inclined with respect to a front surface of the electron supply layer.

7. The nitride semiconductor device according to claim 6, wherein the gate electrode has a smaller thickness than the gate layer.

8. A nitride semiconductor device comprising:
an electron transit layer;
an electron supply layer that is formed on the electron transit layer;
a gate layer that is formed on the electron supply layer and includes an $Al_{1-X}Ga_XN$ (0<X<1) based semi-insulating material containing a first impurity;
a gate electrode that is formed on the gate layer and is in Schottky junction with the gate layer; and
a source electrode and a drain electrode that are electrically connected to the electron supply layer.

9. A nitride semiconductor device, comprising:
an electron transit layer;
an electron supply layer that is formed on the electron transit layer;
a gate layer that is formed on the electron supply layer and includes an $Al_{1-X}Ga_XN$ (0<X<1) based material containing a first impurity;
a gate electrode that is formed on the gate layer and is in Schottky junction with the gate layer; and
a source electrode and a drain electrode that are electrically connected to the electron supply layer, wherein
an Al composition ratio of the gate layer increases linearly or stepwise from the electron supply layer toward the gate electrode.

10. A nitride semiconductor device, comprising:
an electron transit layer;
an electron supply layer that is formed on the electron transit layer;
a gate layer that is formed on the electron supply layer and includes an $Al_{1-X}Ga_XN$ (0<X<1) based material containing a first impurity;
a gate electrode that is formed on the gate layer and is in Schottky junction with the gate layer; and
a source electrode and a drain electrode that are electrically connected to the electron supply layer,
wherein the gate electrode is formed in an inner region of the gate layer such that a step is formed between a side surface of the gate layer and a side surface of the gate electrode, and
the side surface of the gate electrode includes a flat surface that is inclined with respect to a front surface of the electron supply layer and a curved surface that is continuous to the flat surface and bulges toward the inner region of the gate layer.

11. The nitride semiconductor device according to claim 10, wherein the gate electrode has a greater thickness than the gate layer.

* * * * *